United States Patent

[11] 3,593,036

[72] Inventors Stephen P. F. Ma
Santa Monica;
Richard E. Sklar, Los Angeles, both of, Calif.
[21] Appl. No. 885,132
[22] Filed Dec. 15, 1969
[45] Patented July 13, 1971
[73] Assignee Hughes Aircraft Company
Culver City, Calif.

[54] MOSFET MOMENTARY SWITCH CIRCUIT
5 Claims, 3 Drawing Figs.

[52] U.S. Cl. .......... 307/247, 307/251, 307/279, 307/304, 328/164
[51] Int. Cl. .......... H03k 17/16
[50] Field of Search .......... 307/205, 251, 279, 247, 304; 328/164

[56] References Cited
UNITED STATES PATENTS

| | | | |
|---|---|---|---|
| 3,324,306 | 6/1967 | Lockwood | 307/247 (A) X |
| 3,381,143 | 4/1968 | Brahan | 307/279 X |
| 3,430,071 | 2/1969 | Sheng | 307/247 (A) |
| 3,471,789 | 10/1969 | Nutting et al. | 307/247 A UX |
| 3,476,879 | 11/1969 | Zenner | 307/247(A) UX |
| 3,508,079 | 4/1970 | Moll et al. | 307/247 (A) |
| 3,518,451 | 6/1970 | Booher | 307/251 X |

*Primary Examiner*—Stanley T. Krawczewicz
*Attorneys*—James K. Haskell and Bernard P. Drachlis

ABSTRACT: A metal oxide semiconductor field effect transistor (MOSFET) circuit of a type that can be constructed on a single semiconductor substrate which accepts a signal from a manually operated momentary switch and provides a DC output signal at one of two possible voltage levels. The circuit includes a trigger flip-flop which provides the DC output signal. The circuit also includes a NOR gate, an RS flip-flop and an inverter interconnected in a manner to prevent the spurious signals caused by switch contact bounce or line noise from giving an incorrect indication at the output of the circuit.

INVENTORS.
STEPHEN P. F. MA,
RICHARD E. SKLAR,
BY
Bernard P. Drachlf
ATTORNEY.

MOSFET MOMENTARY SWITCH CIRCUIT

BACKGROUND OF THE INVENTION

In many systems, mainly digital systems, the use of momentary, manually operated switches to initiate a desired function is required. It is desirable to have a positive indication that a switch has been closed. Major problems have been the undesirable effects of switch contact bounce and line noise. Logic circuitry can be constructed to eliminate the undesirable effects of switch contact bounce and to provide a well defined waveform when a switch is closed. The same circuitry is effective in providing high noise immunity.

SUMMARY OF THE INVENTION

The present invention relates generally to MOSFET circuits and more particularly to digital switching circuits of a type that can be constructed on a single semiconductor substrate using metal oxide semiconductor field effect transistor (MOSFET) techniques. More particularly, the circuit accepts a signal from a manually operated momentary switch. The signal from the switch will not have a well defined waveform due to switch contact bounce. The circuit includes a trigger flip-flop which will provide an output signal indicative of switch action and which will have a well defined waveform. The circuit also includes an RS flip-flop, a NOR gate, and an inverter which are interconnected to provide a signal to the trigger flip-flop input which is insensitive to the spurious signals caused by switch contact bounce or by line noise. The complete circuit can be constructed on a single semiconductor substrate or as a portion of a larger semiconductor substrate used for other control functions. The additional costs involved in providing the semiconductor circuits is more than offset by the weight saving.

DESCRIPTION OF THE DRAWINGS

The novel features and advantages of the invention will become more apparent from the following detailed description when taken in conjunction with the accompanying drawings in which.

DESCRIPTION OF THE PREFERRED EMBODIMENT

Figure 1:
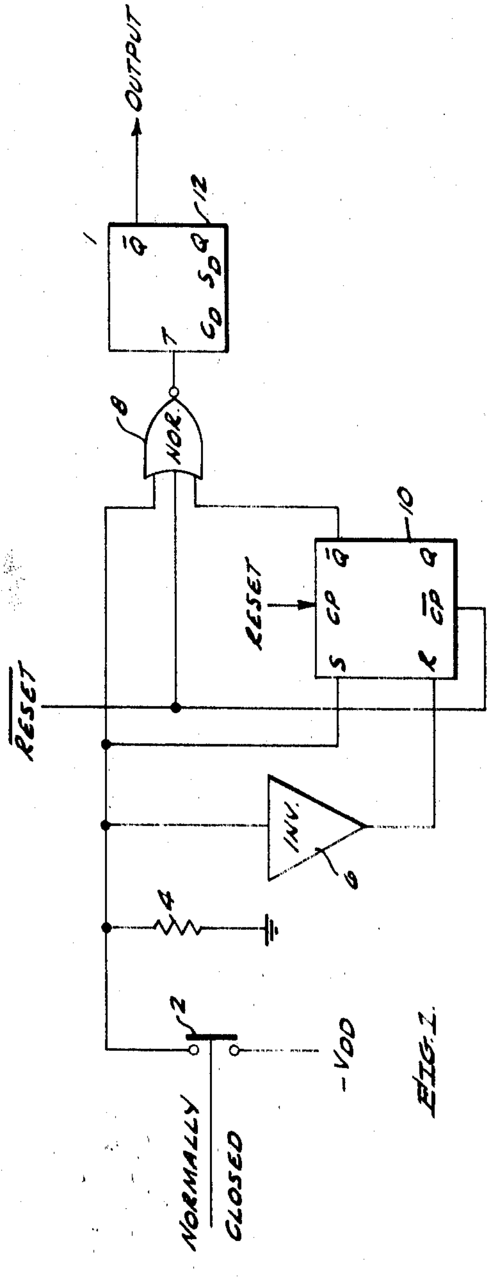
FIG. 1 is a logic diagram illustrating the circuit of the invention.
Figure 2:
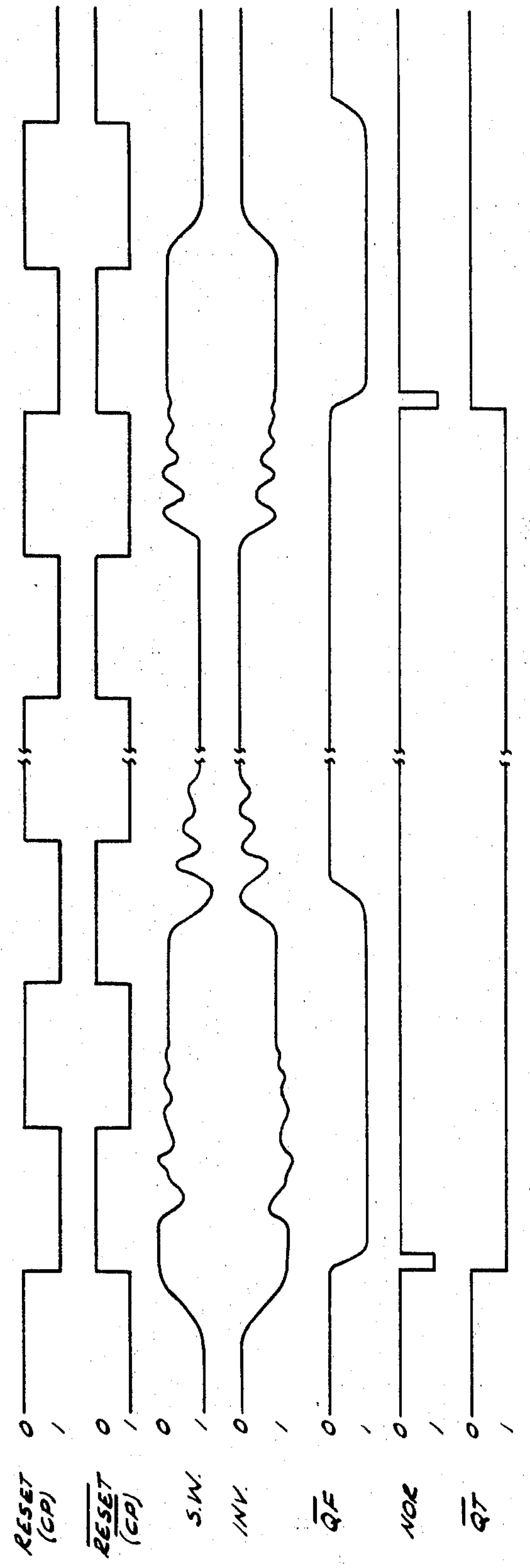
FIG. 2 is a waveform diagram of the operation of the circuit.

The invention will be described in terms of a negative logic system utilizing P-channel enhancement mode MOS devices where ground voltage level indicates a logic "0" and a negative voltage level indicates a logic "1." It will be clear to those skilled in the art that a positive logic system could be used with appropriate changes in the supply voltages applied to the circuitry and using N-channel enhancement mode MOS devices. A switch 2 shown in FIG. 1 has a first contact connected to the logic "1" voltage level $-V_{DD}$. The second contact is connected to one end of a resistor 4, the other end of which is connected to a ground terminal. The second switch contact is further connected to an inverter 6, one input of a NOR gate 8, and the set input S of an RS flip-flop 10. The output of the inverter 6 is applied to the reset input R of the RS flip-flop 10. The switch 2 will be normally closed, thus the $-V_{DD}$ voltage, which is logic "1"level, will be applied to the input of the inverter 6, the first input of the NOR gate 8 and the set input S of the flip-flop 10. A RESET signal, which is essentially a clock pulse signal (CP), is applied to the CP input of flip-flop 10. The RESET signal is shown as waveform RESET in FIG. 2. The $\overline{RESET}$ signal, which is an inverted clock pulse signal $\overline{CP}$ is applied to the $\overline{CP}$ input of flip-flop 10, and also to a second input of the NOR gate 8. The $\overline{RESET}$ signal is shown as waveform $\overline{RESET}$ in FIG. 2. The significance of the $\overline{RESET}$ signal being applied to the flip-flop 10 will be explained subsequently when the circuitry is described in more detail. For now, it is sufficient to say that the $\overline{RESET}$ signal is used as part of the input gating for the set and reset inputs S and R of the flip-flop 10.

In the steady state condition when the switch 2 is closed, a logic "1" signal will be applied to the set input S of the flip-flop 10. A logical "0" signal will be applied to the reset input of the flip-flop 10 from the output of the inverter 6. This will place the flip-flop 10 in a set condition. The reset output $\overline{Q}_F$ of the flip-flop 10, which will be in a logic "0" state, is applied to a third input of the NOR gate 8. In this condition it can be seen that at least one input to NOR gate 81, that is, the input from the switch 2, will normally be in a logic "1" condition. This will keep the output of the NOR gate 8 at logic "0." The output of the NOR gate 8 will go to logic "1" only when all inputs to the gate are at logic "0."

Now, when the switch 2 is manually depressed, the $-V_{DD}$ voltage level is removed from the second switch contact. This will allow ground voltage level, which indicates a logic "0," to be applied through the resistor 4 to the input of the inverter 6. The output of the inverter will go to logic "1" and be applied to the reset input R of the RS flip-flop 10. A logic "0" will also be applied from the resistor 4 to the set input S of the RS flip-flop 10 and also to the first input of the NOR gate 8. The signal resulting from the opening of the switch 2 and its associated contact bounce is shown in the waveform labeled SW in FIG. 2. The inverter 6 output signal is shown as the waveform labeled INV in FIG. 2. The reset output $\overline{Q}_F$ of the RS flip-flop 10 will change state according to the signals applied to the R and S inputs of the flip-flop only when the RESET waveform applied to input terminal CP goes from a logic "0" to a logic "1."This also means that the $\overline{RESET}$ waveform is going from a logic "1" to a logic "0." When the $\overline{RESET}$ signal get to logic "0" all three inputs of the NOR gate 8 will be at logic "0." This will allow the output of the NOR gate 8 to go to logic "1." This is shown as the waveform labelled NOR in FIG. 2. When the RESET pulse goes to logic "1," it will change the state of the RS flip-flop 10 according to the signals applied to the R and S inputs. Since the reset input R of RS flip-flop 10 is at logic "1," the flip-flop 10 will be reset. The reset output of the flip-flop 10 will go to logic "1." This will apply logic "1" to the input of the NOR gate 8 which will make the output of the NOR gate go to logic "0." Thus, the NOR gate 8 output is at logic "1" for only a short period of time. The operation of the circuit depends upon the flip-flop 10 being slower than the NOR gate 8. This can be readily accomplished with MOSFET techniques. The output of the NOR gate 8 is connected to the trigger input T of a trigger flip-flop 12. When the output of the NOR gate 8 goes to logic "1," the trigger flip-flop 12 will change states. It can be seen that spurious signals caused by contact bounce will have no effect on the trigger flip-flop 12 because the spurious signals will not be gated through the NOR gate 8. It is further seen that the circuitry provides high noise immunity. When the switch is depressed, any noise which appears on the contact input lines is treated in the same manner as is contact bounce and is not gated through the NOR gate 8. When the switch 2 is released and the contacts close, a logic "1" is applied to the input to the inverter 6, which will in turn apply a logic "0" to the reset input R of RS flip-flop 10. Releasing the switch 2 also applies a logic "1" to the set input S of the RS flip-flop 10. At the next RESET pulse applied to input terminal CP, the flip-flop 10 will be reset causing output $\overline{Q}_F$ to go to logic "0." This establishes the initial condition of the logic circuitry for the next time the switch is depressed. When the switch is again depressed, the circuitry will operate in the same manner and the trigger flip-flop 12 will again change states.

Figure 3:
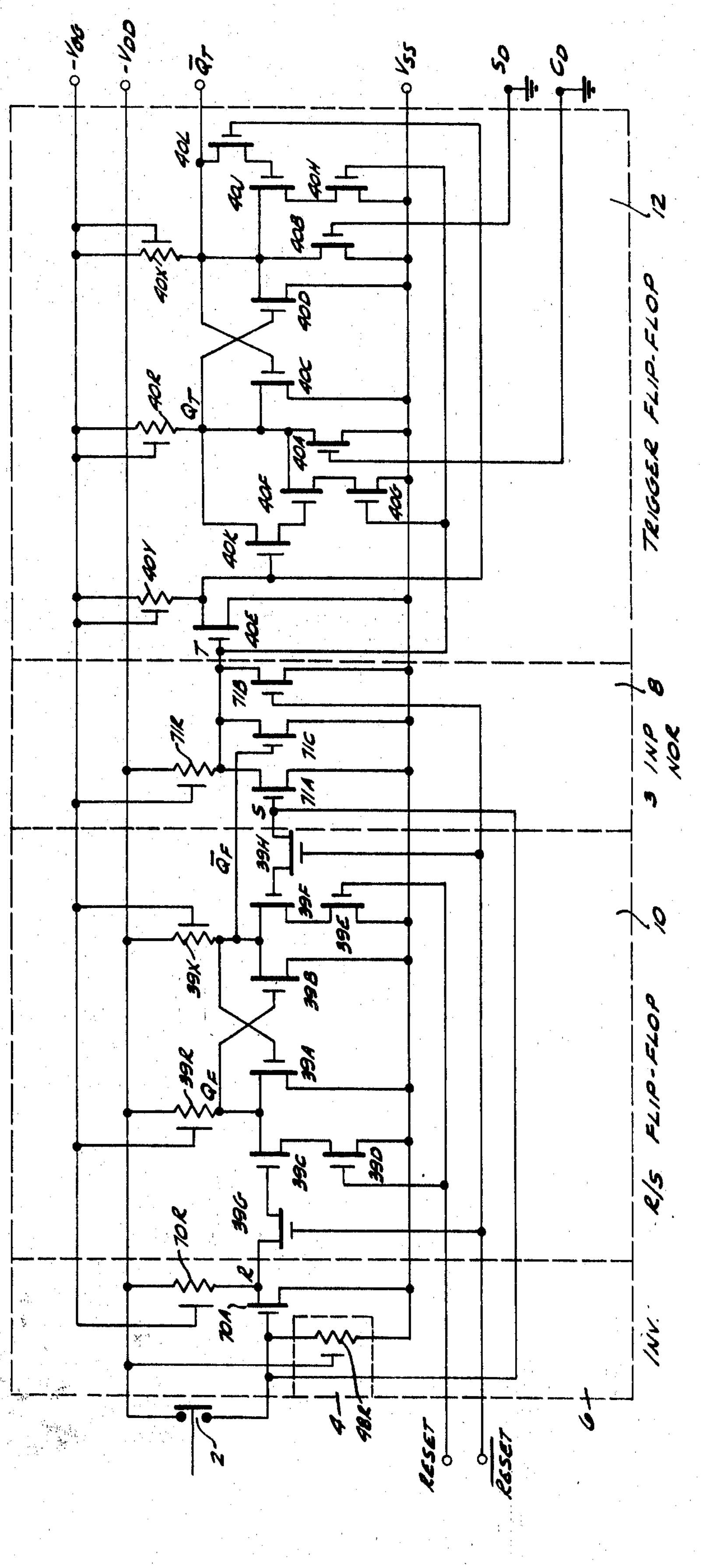
FIG. 3 is a circuit diagram illustrating the detailed circuit of the invention.

The detailed circuit diagram is shown in FIG. 3. All parts of the circuit except the switch 2 are constructed on a single semiconductor substrate using standard Metal Oxide Semiconductor Field Effect Transistor (MOSFET) techniques. The MOSFET circuit is constructed to operate in the enhancement mode with an N-type substrate. This means that for a MOSFET to conduct, the gate voltage will be negative with respect to the source voltage. The source terminal $V_{SS}$ is connected to ground. The logic levels used for the circuit are ground to indicate a logic "0" and a negative voltage, which may be −15 v., for example, to indicate a logic "1." The drain supply voltage $-V_{DD}$ is at the logic "1" voltage level. The gate supply voltage $-V_{GG}$ for the MOS field controlled resistors is much more negative than $-V_{DD}$ and may be at −30 v., for example. This means that for a MOSFET to conduct a logic "1" will be applied to the gate of the MOSFET.

The switch 2 is normally closed. One contact of the switch 2 is connected to $-V_{DD}$. The other contact is connected to various parts of the MOSFET circuit. When the switch 2 is closed, a logic "1" ($-V_{DD}$) is applied to the MOSFET circuit. A logic "1" from the switch 2 is applied to the gate of MOSFET 70A. MOSFET 70A operates as the inverter 6. The source of the MOSFET 70A is connected to ground. The drain of the MOSFET 70A is connected to a MOS field controlled resistor 70R. The drain of the MOSFET 70A is also the output terminal of the inverter. When a logic "1" signal is applied to the gate of MOSFET 70A, the MOSFET conducts, allowing the ground voltage on the source to be conducted to the drain. The drain of the MOSFET 70A is connected to one terminal of MOSFET 39G which operates as the reset input of the RS flip-flop 10.

A logic "1" from the switch 2 is also applied to the gate of a MOSFET 71A, which operates as one input of the NOR gate 8 and one terminal of a MOSFET 39H which operates as the set input of RS flip-flop 10. In the normal condition, when the switch 2 is closed, a logic "1" will be applied to the set input S of the RS flip-flop 10 and a logic "0" will be applied from the inverting MOSFET 70A to the reset input R of the RS flip-flop 10. In this situation, when a $\overline{\text{RESET}}$ signal goes to logic "1," the MOSFET 39H will conduct since logic "1" will be applied to its gate. This will allow logic "1" from the switch 2 to be applied to the gate of a MOSFET 39F. When the $\overline{\text{RESET}}$ signal is true, this will also apply logic "1" to the MOSFET 39G which will allow the MOSFET to conduct. When this conducts, ground will be applied through the MOSFET 39G to the gate of MOSFET 39C. This will prevent the MOSFET 39C from conducting. Now, when the RESET signal goes true and a $\overline{\text{RESET}}$ signal goes false, the MOSFET's 39G and 39H will be turned off. This will mean that the MOSFET 39C will still not conduct because it will not have a logic "1" on its gate. The RESET signal being true will apply logic "1" to the gate of MOSFET's 39D and 39E and will allow these MOSFET's to conduct. Since the MOSFET 39D is connected in series with the MOSFET 39C, the effect of the MOSFET 39D conducting will have no effect on the remainder of the circuit. However, MOSFET 39E is now conducting. MOSFET 39H has been turned off since the $\overline{\text{RESET}}$ signal has gone to logic "0." However, the logic "1" signal that has been applied to the gate of the MOSFET 39F will remain for some time and decay according to the capacitance characteristics of the MOSFET. The decay is slow enough to allow the MOSFET 39F to remain conducting long enough for the logic "0" signal to go through the MOSFET 39E and the MOSFET 39F and be applied to the gate of a MOSFET 39A. The MOSFET 39A and a MOSFET 39B are interconnected in a standard flip-flop arrangement with MOS field controlled resistors 39R and 39X. When the gate of the MOSFET 39A is put to ground, it prevents the MOSFET 39A from conducting. We have seen before that the MOSFET 39C is not conducting. Therefore, there is no conducting path from the node $Q_F$ to ground. In this case, the negative voltage $-V_{DD}$ will show through the MOS field controlled resistor 39R to the node $Q_F$. This logic "1" level is applied to the gate of the MOSFET 39B. This will allow current to flow through the MOS field controlled resistor 39X keeping the node $\overline{Q_F}$ at ground level. In this condition, the flip-flop is set. The reset output or the node $\overline{Q_F}$ is applied to the gate of a MOSFET 71C which is a second input of the NOR gate 8.

The $\overline{\text{RESET}}$ signal is applied to the gate of a MOSFET 71B which is a third input of the NOR gate 8. The three MOSFET's 71A, 71B and 71C and the MOS field controlled resistor 71R are interconnected to form a three-input NOR gate. The output of the NOR gate, which is the common interconnection of the drains of the three MOSFET's 71A, 71B and 71C, will be at logic "0" unless all three inputs to the NOR gate are at logic "0," in which case the output will go to logic "1." As noted above, the input to the MOSFET 71C is at logic "0." The input to the MOSFET 71A is at logic "1" when the switch 2 is not depressed. And the input to the MOSFET 71B will be a square wave going between logic "0" and logic "1." It can be seen that at least one input, namely, the input to the gate of the MOSFET 71A, will be at logic "1." This will keep the output of the NOR gate at logic "0."

When the switch 2 is depressed, the logic "1" from the switch will no longer be applied to the circuit as discussed above. The switch contact will be open circuited. This will allow the ground voltage level to be applied through the MOS field controlled resistor 48R to the gate of the MOSFET 70A and to the set input of the flip-flop 10. In this condition, the MOSFET 70A will not conduct and there will be no current passed through the MOS field controlled resistor 70R to the ground. Therefore, the drain of the MOSFET 70A will be at logic "1." This will apply logic "1" to the reset input of the flip-flop 10, which is one terminal of the MOSFET 39G. Ground will also be applied to the set input of the flip-flop 10, which is one terminal of the MOSFET 39H.

When the $\overline{\text{RESET}}$ signal is true, the logic "1" on the reset input to the flip-flop 10 will be conducted through the MOSFET 39G and be applied to the gate of the MOSFET 39C. In a similar manner, ground will be conducted through the MOSFET 39H and be applied to the gate of the MOSFET 39F.

Now, when the RESET signal goes true and the $\overline{\text{RESET}}$ signal goes false, the flip-flop 10 will switch states in a manner similar to that discussed above for the setting of the flip-flop 10. In particular, the MOSFET's 39G and 39H will be turned off. This will mean that the MOSFET 39F will not conduct because it will not have a negative voltage on its gate. The RESET signal being true, will apply logic "1" to the gate of MOSFET's 39D and 39E, and will allow these MOSFET's to conduct. Since the MOSFET 39E is connected in series with the MOSFET 39F, the effect of the MOSFET 39E conducting will have no effect on the remainder of the circuit. However, MOSFET 39D is now conducting. MOSFET 39G has been turned off since the $\overline{\text{RESET}}$ signal has gone to ground. However, the logic "1" signal that has been applied to the gate of the MOSFET 39C will remain for some time and decay according to the capacitance characteristics of the MOSFET. The decay is slow enough to allow the MOSFET 39C to remain conducting long enough for the ground signal to go through the MOSFET 39D and MOSFET 39C and be applied to the gate of the MOSFET 39B. When the gate of the MOSFET 39B is put to ground, it prevents the MOSFET 39B from conducting. As noted above, the MOSFET 39F is not conducting. Therefore, there is no conducting path from the node $\overline{Q_F}$ to ground. In this case, the logic "1" will show through the MOS field controlled resistor 39X to the node $\overline{Q_F}$. This logic "1" is applied to the gate of the MOSFET 39A. This allows current to flow through the MOS field controlled resistor 39R, keeping the node $Q_F$ at ground level. In this condition, the flip-flop is reset. The reset output which is the node $\overline{Q_F}$ is applied to the gate of the MOSFET 71C as noted above, which is a second input of the NOR gate 8.

It should be noted that the switching time of the flip-flop 10 is much slower than the switching time of the NOR gate 8. Thus, when the switch 2 is depressed, the input to the gate of the MOSFET 71A goes to logic "0" long before the input to the gate of the MOSFET 71C will go to logic "1." Also, the flip-flop will not begin to switch states until the RESET signal goes true and the $\overline{\text{RESET}}$ signal goes false. This means that the input to the gate of the MOSFET 71B will go to ground before the flip-flop 10 will begin to switch states. Thus, when the flip-flop 10 is beginning to switch states, all inputs to the NOR gate 8 are at ground level. This means that there is no conducting path from ground to the output of the NOR gate. This allows the logic "1" to show through the MOS field controlled resistor 71R to the output of the NOR gate 8. The NOR gate 8 output is applied to the input of the trigger flip-flop 12, which is the gate of a MOSFET 40E. Now, when the flip-flop 10 completes its switching cycle, the input to the gate of the MOSFET 71c will go to logic "1." This will again supply a conducting path from ground to the output of the NOR gate 8. This will switch the output of the NOR gate 8 back to logic "0."Thus it can be seen that the output of the NOR gate 8 is at a logic "1" level for only a very short period of time. However, this time is sufficient to allow the trigger flip-flop 12 to change states.

The operation of the trigger flip-flop 12 will now be described. The trigger flip-flop 12 includes two MOSFET's 40C and 40D interconnected with MOS field controlled resistors 40R and 40X in a standard flip-flop arrangement. Thus, when the MOSFET 40C, for example, is conducting a conducting path to ground will be provided. This will hold the set output node $Q_T$ of the trigger flip-flop 12 to ground level. This ground level will in turn be applied to the gate of the MOSFET 40D, which will keep the MOSFET 40D from conducting. This means that the reset output node $\overline{Q_T}$ of the trigger flip-flop 12 will be held to a logic "1" level through the MOS field controlled resistor 40X. This logic "1" will be applied to the gate of the MOSFET 40C which will keep the MOSFET 40C conducting. The trigger flip-flop 12 also includes a MOSFET 40A which operates as a direct reset for the flip-flop. This operates as follows: When a logic "1" is applied to the terminal $C_D$, it is applied to the gate of the MOSFET 40A. This will allow the MOSFET 40A to conduct and will provide a path from the set output node $Q_T$ of the trigger flip-flop 12 to ground. The trigger flip-flop 12 also includes a MOSFET 40B which operates as a direct set input to the flip-flop. This operates in exactly the same manner as the MOSFET 40A except it provides a path to ground for the reset output node $\overline{Q_T}$ of the trigger flip-flop 12. The direct set and the direct reset inputs to the trigger flip-flop may be used to initialize the circuit when starting operation.

As noted above, the input to the trigger flip-flop 12 is held at a logic "1" level for only a very short period of time. Therefore, the normal condition for the input to the trigger flip-flop 12 is a logic "0" level. The input to the trigger flip-flop 12 is applied to the gate of a MOSFET 40E which is interconnected with a MOS field controlled resistor 40Y to operate as an inverter circuit. Thus, the input to the gate of the MOSFET 40E is normally at logic "0" and the drain of the MOSFET 40E will be held normally to logic "1." This logic "1" signal is applied to the gate of MOSFET's 40K and 40L. One terminal of the MOSFET 40K is connected to the set output node $Q_T$ of the trigger flip-flop 12. The other terminal of the MOSFET 40K is connected to the gate of a MOSFET 40F. Now, assume that the trigger flip-flop 12 is set. This will mean that the node $Q_T$ will be at logic "1." This will apply a logic "1" to the gate of the MOSFET 40D to provide a path to ground to the node $\overline{Q_T}$ which is in turn connected to the gate of the MOSFET 40C. This will prevent the MOSFET 40C from conducting and keep the node $Q_T$ at a logic "1" condition. Now, since the normal input to the trigger flip-flop is a logic "0," the drain of the MOSFET 40E is at a logic "1" which is connected to the gate of the MOSFET 40K. This will allow the MOSFET 40K to conduct. This allows the logic "1" signal to be applied to the gate of a MOSFET 40F which will allow the MOSFET 40F to conduct. The input to the trigger flip-flop 12 is also applied to the gate of a MOSFET 40G which is connected in series with the MOSFET 40F. However, the normal input to the gate of the MOSFET 40G is a logic " 0." Therefore, the MOSFET 40G normally will not conduct. When a logic "1" signal is applied to the input of the trigger flip-flop 12, the MOSFET 40E will begin to conduct. This will mean that the drain of the MOSFET 40E will go to ground, or logic "0," which will be applied to the gate of the MOSFET 40K. However, at this time, since the input to the trigger flip-flop 12 has gone to a logic "1," which is applied to the gate of the MOSFET 40G, the MOSFET 40G will begin to conduct. As noted above, the MOSFET 40F is already conducting, since it has a logic "1" signal applied through the MOSFET 40K to the gate of the MOSFET 40F. Thus, a conducting path will be established between ground and the set output node $Q_T$ of the trigger flip-flop 12. This will turn off the MOSFET 40D and turn on the MOSFET 40C to maintain the conducting path to the set output node $Q_T$. It should be noted that the gate of the MOSFET 40K has a logic "0" applied to it which will turn off the MOSFET 40K and in turn will turn off the MOSFET 40F. However, the negative charge built up on the gate of the MOSFET 40K will remain for a sufficient amount of time to allow the MOSFET 40F to remain conducting until the trigger flip-flop 12 has switched state.

The input to the trigger flip-flop 12 is also connected to the gate of a MOSFET 40H which is connected in series with the MOSFET 40J. The gate of the MOSFET 40J is connected to one terminal of a MOSFET 40L, the other terminal of which is connected to the reset output node $\overline{Q_T}$ of the trigger flip-flop 12. The MOSFET's 40L, 40J and 40H operate in exactly the same manner as the MOSFET's 40K, 40F and 40G to switch the flip-flop 12 when it was initially in a reset state.

What we claim is:

1. A circuit of a type which can be constructed on a single semiconductor substrate by metal oxide semiconductor field effect transistor techniques which comprises:

a gate coupled to receive first, second and third digital input signals, each of said digital input signals having a first (F) and second (T) state, said gate providing a digital output signal having a first (F) and a second (T) state, the digital output signal being in its second (T) state only when the first, second and third input signals are in the first (F) state; and circuit means coupled to receive the first digital input signal and the second digital input signal, said circuit means providing the third digital input signal in its first (F) state when the first digital input signal is in its second (T) state and the second digital input signal is in its second (T) state and providing the third digital input signal in its second (T) state when the first digital input signal is in its first (F) state and the second digital input signal is in its first (F) state, said circuit means providing the third digital input signal in its second (T) state after the digital output signal of said gate is in its second (T) state and before the second digital input signal returns to its second (T) state.

2. A circuit as claimed in claim 1 which further includes:

a trigger flip-flop coupled to receive the digital output signal of said gate and operable to change states when the digital output signal of said gate is in the second (T) state.

3. A circuit as claimed in claim 1 wherein said first digital input signal is provided by a manually operated momentary switch.

4. A circuit as claimed in claim 1 wherein said circuit means includes:

an inverter having an input coupled to receive the first digital input signal and providing an inverted output signal;

a flip-flop having a set input, a reset input, a clock pulse input coupled to receive a fourth digital input signal which is the complement of the second digital input signal, and a reset output for providing the third digital input signal, said flip-flop being operable to change states according to signals applied to its set input and its reset input when the fourth digital input signal is in its second (T) state;

a first gating MOSFET having a first signal terminal coupled to receive the inverted output signal of said inverter, a second signal terminal coupled to the reset input of said flip-flop, and a gate terminal coupled to receive the second digital input signal; and a second gating MOSFET having a first signal terminal coupled to receive the first digital input signal, a second signal terminal coupled to the set input of said flip-flop, and a gate terminal coupled to receive the second digital input signal.

5. A MOSFET trigger flip-flop circuit operable to receive an input signal and to provide first and second output signals, said MOSFET trigger flip-flop circuit comprising:

a flip-flop having a first input, a second input, a first output for providing the first output signal, a second output for providing the second output signal, and a clock pulse input coupled to receive the input signal;

said flip-flop operable to change states according to the signals applied to its first and second inputs when a signal is applied to its clock pulse input;

a first gating MOSFET having a first signal terminal coupled to receive the first output signal, a second signal terminal coupled to the first input of said flip-flop, and a gate terminal;

a second gating MOSFET having a first signal terminal coupled to receive the second output signal, a second signal terminal coupled to the second input of said flip-flop, and a gate terminal; and MOSFET inverting means coupled to receive the input signal for providing an inverted output signal, the inverted output signal being applied to the gate terminals of said first and said second gating MOSFET's.

Disclaimer 3,593,036.—*Stephen P. F. Ma*, Santa Monica, and *Richard E. Sklar*, Los Angeles, Calif. MOSFET MOMENTARY SWITCH CIRCUIT. Patent dated July 13, 1971. Disclaimer filed Aug. 17, 1972, by the assignee, *Hughes Aircraft Company*.

Hereby enters this disclaimer to claim 5 only of said patent.

[*Official Gazette January 16, 1973.*]